United States Patent
Yoo et al.

(10) Patent No.: US 8,652,886 B2
(45) Date of Patent: Feb. 18, 2014

(54) THIN FILM TRANSISTOR ARRAY SUBSTRATE FOR A DISPLAY PANEL AND A METHOD FOR MANUFACTURING A THIN FILM TRANSISTOR ARRAY SUBSTRATE FOR A DISPLAY PANEL

(71) Applicant: Samsung Display Co., Ltd., Yongin (KR)

(72) Inventors: Hyeong-Suk Yoo, Yongin-si (KR); Ho-Jun Lee, Anyang-si (KR); Sung-Ryul Kim, Cheonan-si (KR); O-Sung Seo, Seoul (KR); Hong-Kee Chin, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/870,053

(22) Filed: Apr. 25, 2013

(65) Prior Publication Data

US 2013/0309821 A1 Nov. 21, 2013

Related U.S. Application Data

(63) Continuation of application No. 12/560,652, filed on Sep. 16, 2009, now Pat. No. 8,476,633.

(30) Foreign Application Priority Data

Jun. 3, 2009 (KR) .......................... 10-2009-0049090

(51) Int. Cl.
*H01L 21/00* (2006.01)

(52) U.S. Cl.
USPC .............. 438/149; 438/151; 257/59; 257/72; 257/E21.023; 257/E21.026; 257/E29.117; 257/E51.005

(58) Field of Classification Search
USPC .............. 438/149, 151; 257/59, 72, E21.023, 257/E21.026, E29.117, E51.005
See application file for complete search history.

(56) References Cited

U.S. PATENT DOCUMENTS

| | | | |
|---|---|---|---|
| 6,441,401 B1 | 8/2002 | Jung et al. | |
| 7,466,026 B2 | 12/2008 | Song et al. | |
| 7,683,375 B2 | 3/2010 | Tanaka | |
| 8,017,459 B2 | 9/2011 | Yang et al. | |
| 8,039,302 B2 | 10/2011 | Tay et al. | |

*Primary Examiner* — Kenneth Parker
*Assistant Examiner* — John Lin
(74) *Attorney, Agent, or Firm* — F. Chau & Associates, LLC (57) ABSTRACT

A method of manufacturing a thin film transistor array substrate includes forming a gate pattern on a substrate, forming a gate insulating film on the substrate, forming a source/drain pattern and a semiconductor pattern on the substrate, forming first, second, and third passivation films successively on the substrate. Over the above multi-layered passivation film forming a first photoresist pattern including a first portion formed on part of the drain electrode and on the pixel region, and a second portion. The second portion is thicker than the first portion. Then, patterning the third passivation film using the first photoresist pattern, forming a second photoresist pattern by removing the first portion of the first photoresist pattern, forming a transparent electrode film on the substrate, removing the second photoresist pattern and the transparent electrode film disposed on the second photoresist pattern, and forming a transparent electrode pattern on the second passivation layer.

7 Claims, 14 Drawing Sheets

THIN FILM TRANSISTOR ARRAY SUBSTRATE FOR A DISPLAY PANEL AND A METHOD FOR MANUFACTURING A THIN FILM TRANSISTOR ARRAY SUBSTRATE FOR A DISPLAY PANEL

CROSS-REFERENCE TO RELATED APPLICATION

This application is a divisional application of co-pending U.S. application Ser. No. 12/560,652 filed on Sep. 16, 2009, which claims priority to Korean Patent Application No. 10-2009-0049090 filed on Jun. 3, 2009, the disclosures of which are each hereby incorporated by reference herein in their entireties.

BACKGROUND OF THE INVENTION

1. Technical Field

The present disclosure relates to a thin film transistor array substrate and to a method of manufacturing a thin film transistor array substrate for a display panel, and more particularly, to a thin film transistor array substrate and to a method of manufacturing a thin film transistor array substrate for a display panel capable of reducing the number of steps in a mask process.

2. Description of the Related Art

In general, a liquid crystal display device displays an image by adjusting the transmittance of a liquid crystal material using an electric field. For this purpose, the liquid crystal display device may include a liquid crystal display panel in which the liquid crystal cells are arranged in a matrix pattern, and a driving circuit for driving the liquid crystal display panel.

The liquid crystal display panel may include the thin film transistor array substrate and a color filter array substrate facing each other, a spacer located for fixedly maintaining a cell gap between two substrates and a liquid crystal injected into the cell gap.

The thin film transistor array substrate may include gate lines and data lines, a thin film transistor formed as a switching device at every crossing of the gate lines and the data lines, a pixel electrode connected to the thin film transistor substantially defining a liquid crystal cell, and an alignment film applied to the substrate. The gate lines and the data lines receive signals from the driving circuits through each of their respective pad parts. The thin film transistor, in response to a scan signal supplied to a gate line, supplies to the pixel electrode a pixel voltage signal applied to the data line.

The color filter array substrate may include a color filter formed to correspond to the liquid crystal cells, a black matrix for reflecting external light and separating the color filters, a common electrode for commonly supplying a reference voltage to the liquid crystal cells, and an alignment film applied to the substrate.

The liquid crystal display panel may be fabricated by combining the thin film transistor array substrate and the color filter array substrate which are separately manufactured, injecting the liquid crystal material between the substrates, and sealing the substrates having the liquid crystal material between them.

In such a liquid crystal display device, thin film transistor array substrate fabrication may involve a semiconductor process which requires a plurality of mask processes, thereby complicating the manufacturing process. This may be a major factor in the manufacturing cost of the liquid crystal display panel. To solve this, a thin film transistor array substrate has been developed with the goal of reducing the number of steps used in mask processes. This is because one mask process may include a plurality of sub-processes such as, for example, thin film deposition, cleaning, photolithography, etching, photo-resist stripping, inspection processes and the like. Recent development efforts have resulted in a four-round mask process that eliminated one mask process from an existing five-round standard mask process.

As described above, conventional thin film transistor array substrates and manufacturing methods thereof adopt a four-round mask process, thereby reducing the number of steps in the manufacturing processes in comparison with the five-round mask process and hence reduces manufacturing cast accordingly. However, as the conventional four-round mask process may still be a complex manufacturing process which may limit the reduction of the manufacturing costs associated with manufacturing thin film transistor array substrates, there is a still a need in the art for an approach that is capable of further simplifying the manufacturing process and further reducing the manufacturing costs associated with manufacturing thin film transistor array substrates.

SUMMARY OF THE INVENTION

Accordingly, exemplary embodiments of the present invention are directed to a manufacturing method of a thin film transistor array substrate that substantially solves one or more of the difficulties associated with the related art.

Exemplary embodiments of the present invention may provide a simplified thin film transistor array structure and manufacturing process.

Exemplary embodiments of the present invention may reduce the number of mask processes required for manufacturing a thin film transistor array substrate.

In accordance with an exemplary embodiment of the present invention, a thin film transistor array substrate for a display panel is provided. The thin film transistor array substrate for the display panel includes a base substrate, a plurality of gate lines including a gate electrode disposed on the base substrate, a plurality of storage electrode lines disposed on the base substrate, a gate insulating layer disposed on the gate electrode, the plurality of gate lines and the plurality of storage electrode lines, a semiconductor layer including the channel portion disposed on the gate insulating layer, a plurality of data lines including a source electrode, and a drain electrode opposite the source electrode disposed on the semiconductor layer, and a first passivation layer disposed on the plurality of gate lines and the plurality of data lines including an opening exposing the gate insulating layer and a portion of the drain electrode. The first passivation includes one of silicon nitride ($SiN_x$) and silicon oxide ($SiO_x$) and an organic insulating material having a small dielectric constant. The thin film transistor array substrate for the display panel further includes, a second passivation layer disposed on the first passivation layer, and a third passivation layer disposed on the second passivation layer and over the gate electrode, the source electrode and the drain electrode and a pixel electrode disposed on the second passivation layer and connected to the drain electrode.

The storage electrode lines are made of the same material and layer of the gate line further includes a storage electrode line that runs in accordance with the data lines. In addition, the width of the storage electrode line is broader than the data line, so the data line is positioned within the storage electrode line.

In exemplary embodiments of the present invention, the first passivation layer comprising inorganic insulating material such as, for example, SiNx, SiOx, organic insulating material having a small dielectric constant such as, for example, an acrylic organic compound, BCB (benzocyclobutene), PFCB (perfluorocyclobutane) or the like, and the laminated structure thereof.

In the present invention, the second passivation material comprises inorganic insulating material such as, for example, SiNx, SiOx, or SiOxNy. For example regarding SiOxNy, it is desirable that SiOxNy have an oxygen content between about 10 and about 50% and a y value between about 0.2 and about 1.3.

In exemplary embodiments of the present invention, the third passivation layer comprising inorganic insulating material such as, for example, SiNx, SiOx, or SiOxNy over the second passivation layer may be entirely deposited by the same method as the first passivation layer.

In exemplary embodiments of the present invention, it is desirable that the second passivation inorganic insulating layer have the low etch rate compared to the first passivation layer under the same etch conditions. That is to say, it is desirable for the second passivation layer to have the etch selectivity value under about 2:1 compared to the first passivation layer. In addition, it is desirable that the third passivation inorganic insulating layer have a high etch rate compared to the first passivation layer under the same etch conditions. That is to say, it is desirable for the third passivation layer to have an etch selectivity value over about 2:1 compared to the first passivation layer.

For example, regarding SiOxNy, it is desirable that SiOxNy have an oxygen content between about 10 and about 50% and a y value between about 0.2 and about 1.3.

In accordance with another exemplary embodiment of the present invention, a method for manufacturing a thin film transistor array substrate for a display panel is provided. The method includes forming a gate pattern which includes a gate electrode, a plurality of gate lines and a plurality of storage electrode lines on a substrate, forming a gate insulating film on the gate pattern including the gate electrode, the plurality of gate lines and the plurality of storage electrode lines, forming a source/drain pattern and a semiconductor pattern on the substrate, wherein the source/drain patterns includes a plurality of data lines, a source electrode and a drain electrode. The method further includes forming a first passivation film, a second passivation film, and a third passivation film sucessively on the substrate, forming a first photoresist pattern which includes a first portion which is formed on part of the drain electrode and on a pixel region, and a second portion formed on the semiconductor pattern which includes a channel region between the source electrode and the drain electrode and wherein the second portion of the first photoresist pattern has a relatively higher height than the first portion. In addition, the method further includes patterning an exposed portion of the first passivation film, the second passivation film and the third passivation film using the first photoresist pattern, forming the second photoresist pattern by removing the first portion of the first photoresist pattern using an etchback process, patterning an exposed portion of the third passivation layer around the pixel region using the second photoresist pattern, wherein patterning the third passivation film includes over-etching the third passivation film, forming a transparent electrode film on the substrate, removing the second photoresist pattern and the transparent electrode film disposed on the second photoresist pattern, and forming a transparent electrode pattern on the second passivation layer.

The plane shape of the pixel electrode is substantially the same as the plane shape in an open region of the second photoresist pattern.

BRIEF DESCRIPTION OF THE DRAWINGS

Exemplary embodiments of the present invention can be understood in more details from the following description taken in conjunction with the accompanying drawings, in which:

FIGS. 3 to 8F are plan and sectional views showing a method of manufacturing the thin film transistor array substrate according to an exemplary embodiment of the present invention.

DESCRIPTION OF THE EXEMPLARY EMBODIMENTS

Reference will now be made in detail to exemplary embodiments of the present invention, examples of which are illustrated in the accompanying drawings.

Hereinafter, the exemplary embodiments of the present invention will be described in detail with reference to FIGS. 1 to 8F.

Figure 1:
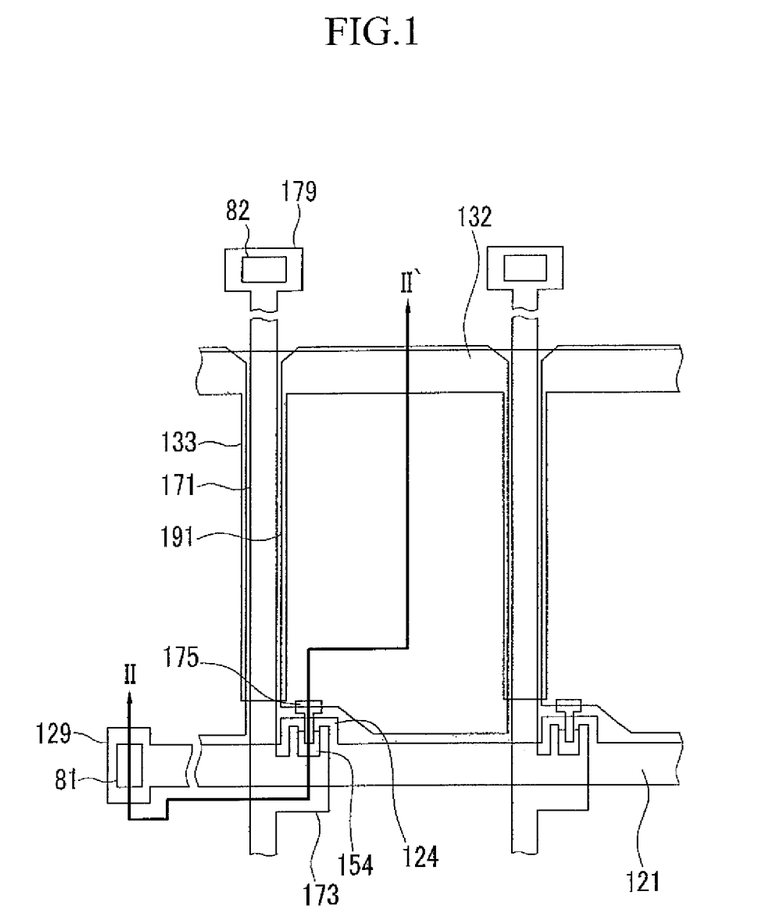
FIG. 1 is a plan view illustrating a thin film transistor array substrate according to an exemplary embodiment of the present invention.
Figure 2:
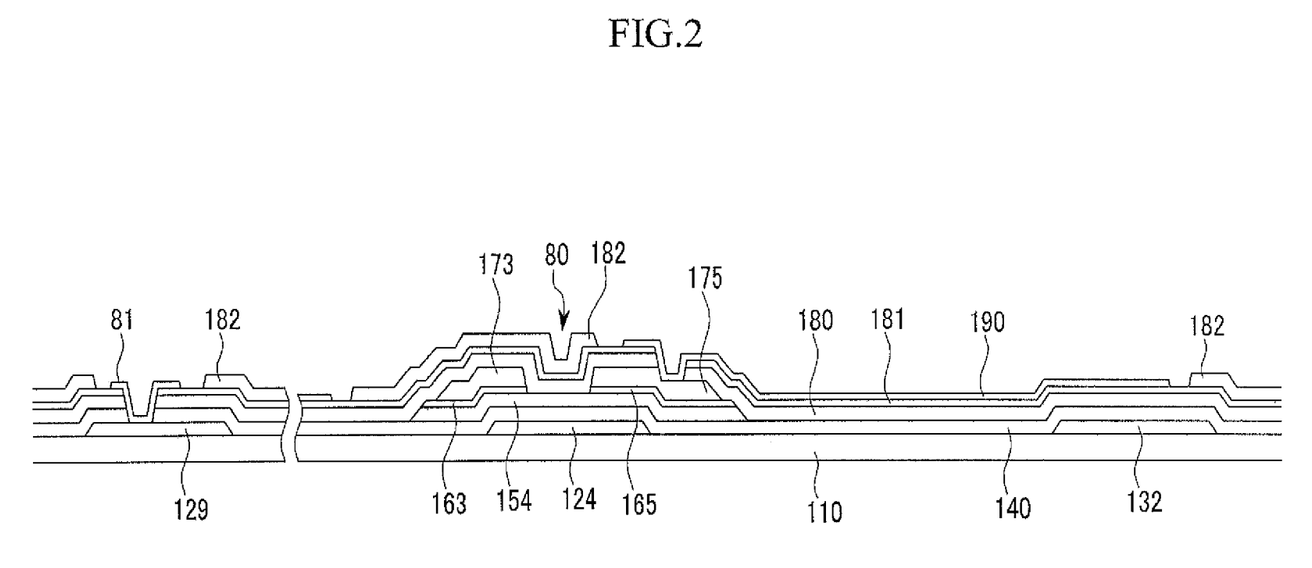
FIG. 2 is a sectional view of the thin film transistor array substrate taken along the line II-II' in FIG. 1.

FIG. 1 is a plan view showing a thin film transistor array substrate according to an exemplary embodiment of the present invention, and FIG. 2 is a sectional view of the thin film transistor array substrate taken along the line II-II' in FIG. 1.

Referring to FIGS. 1 and 2, the thin film transistor array substrate includes a gate line 121, a data line 171, and a gate insulating pattern 140 between them, all of which may be formed on a lower substrate 110. The gate lines 121 and the data lines 171 generally cross each other, with a thin film transistor 80 formed at each crossing, and a pixel electrode 191 formed in a cell region defined by the crossing. In addition, the thin film transistor array substrate further includes a gate pad region 81 connected with the end portion of the gate line 121 and a data pad region 82 connected with the end portion of the data line 171. A storage electrode line 132 is made of the same material and layer of the gate line further includes a storage electrode line 132 that runs in accordance with the data line 171. The width of the storage electrode line 132 is broader than the data line 171, so the data line 171 is positioned within the storage electrode line 132.

The thin film transistor includes a gate electrode 124 connected to the gate line 121, a source electrode 173 connected to the data line 171, a drain electrode 175 connected to the pixel electrode 191, and a semiconductor pattern including an active layer 154 overlapping the gate electrode 124 with the gate insulating pattern 140 positioned therebetween and forming a channel between the source electrode 173 and the drain electrode 175. The thin film transistor, in response to a gate signal supplied to the gate line 121, causes a pixel voltage signal supplied to the data line 171 to be applied to the pixel electrode 191 and be maintained therein.

The semiconductor pattern includes a first active layer 154 overlapping the gate electrode 124, and the gate insulating pattern 140 positioned therebetween. The first active layer 154 has a channel portion between the source electrode 173 and the drain electrode 175. Also the semiconductor pattern includes a second active layer overlapping the storage electrode 133 and the data line 171. The semiconductor pattern may further include an ohmic contact layer 163,165 formed on the active layer 154 for making ohmic contact with the data line 171, source electrode 173, and the drain electrode 175.

The pixel electrode 191 may be connected to the drain electrode 175 of the thin film transistor exposed to the exterior by a first passivation film 180 and a second passivation film 181. The first and second passivation film 180, 181 have an opening exposing part of the drain electrode 175. The pixel electrode 191 may form a potential difference along with a common electrode formed on an upper substrate by accumulating charges according to the pixel voltage. By this potential difference, the molecule making up the liquid crystal material located between the thin film transistor substrate and the upper substrate generally rotate due to a dielectric anisotropy of the liquid crystal material. The rotation of the LC molecules may cause light incident on the pixel electrode 191 from a light source to be transmitted toward the upper substrate.

The plane shape of the pixel electrode 191 may be substantially the same as the plane shape of the open region that is formed by the first passivation layer 180 and the second passivation layer 181 in pixel region because in the pixel electrode forming process, the pixel electrode may be formed by, for example, a lift-off process using the photoresist pattern that is already formed in passivation layer forming process without using a new photoresist pattern to form the pixel electrode. That is to say, for example, a pixel electrode may be deposited all over the substrate including on the photoresist pattern that is already formed in passivation layer forming process, and then the photoresist pattern may be removed by dipping it into a photoresist stripper solution. Only the pixel electrode on the phototresist pattern is removed simultaneously with the photoresist stripper solution, and therefore the pixel electrode on the passivation layer in the pixel region is formed.

The above thin film transistor has the first passivation layer 180 and the second passivation layer 181 all over the substrate including the channel formation region and the pixel region. On the other hand, the third passivation layer 182 is formed only over the thin film transistor including the channel formation region. To apply the lift-off process more effectively, the third passivation layer 182 is used as a sacrificial layer in this exemplary embodiment. That is to say, the third passivation layer 182 located directly below the photoresist pattern is etched more and more to form the undercut region. With the undercut region, the pixel electrode on the phototresist pattern is readily removed simultaneously with the photoresist stripper solution in the lift-off process.

The thin film transistor array substrate having the above-mentioned configuration may be formed through the use of, for example, a three-round mask process. The method of manufacturing the thin film transistor array substrate according to this exemplary embodiment of the present invention using the three-round mask process may include the first mask process for forming the gate line 121, the second mask process for forming the semiconductor pattern and the source/drain pattern 173,175, and the third mask process for forming the passivation film 180 and the transparent electrode patterns 191.

FIGS. 3 to 8F are plan views and sectional views sequentially illustrating an exemplary method of manufacturing the thin film transistor array substrate according to an exemplary embodiment of the present invention.

Figure 3:
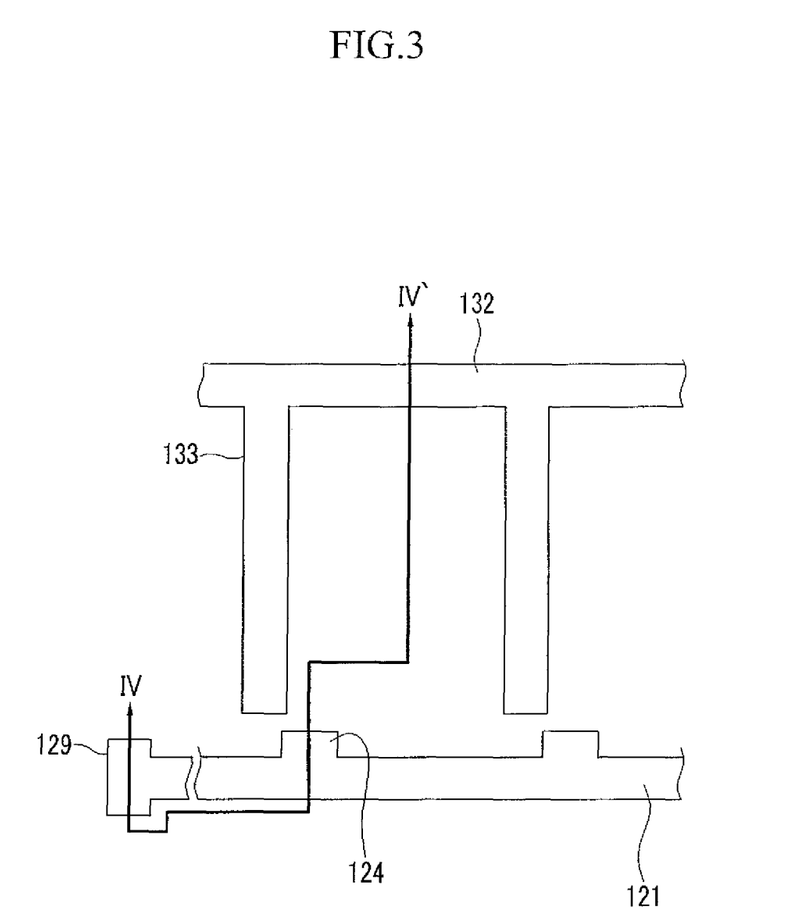
Figure 4:
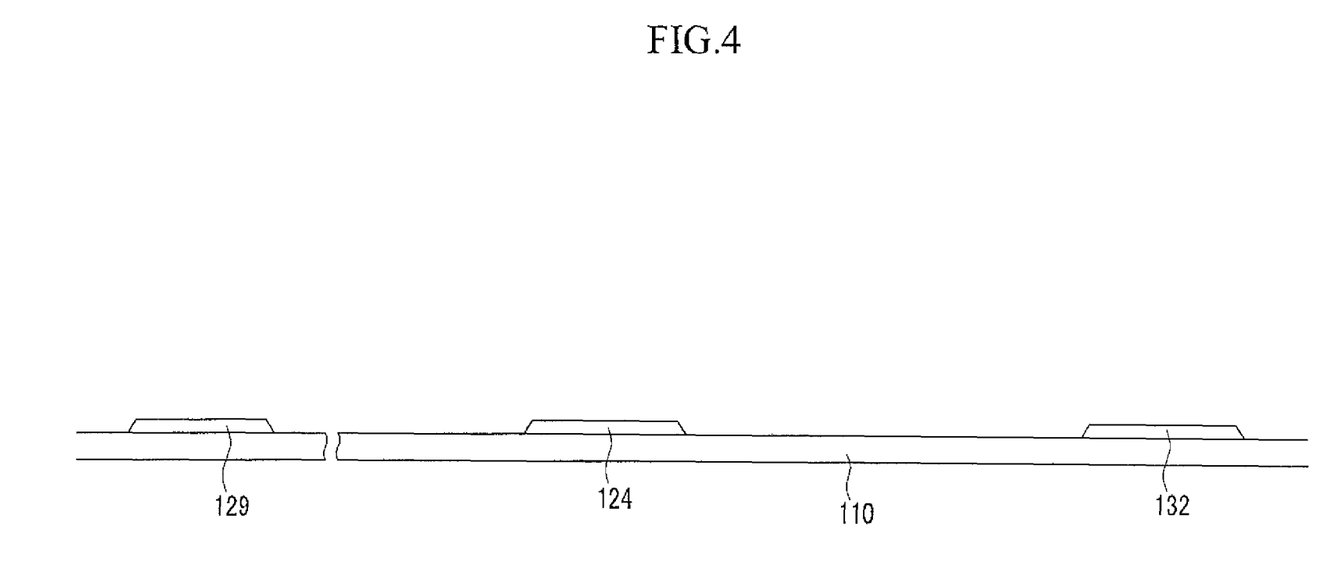

FIGS. 3 and 4 are a plan view and a sectional view, respectively, illustrating the gate patterns formed on the lower substrate 110 by the first mask process in an exemplary method of manufacturing the thin film transistor array substrate according to an exemplary embodiment of the present invention.

The gate metal layer may be formed on the lower substrate 110 by, for example, a deposition method such as a sputtering method. Subsequently, the gate metal layer may be patterned by, for example, a photolithography process using the first mask and an etching process, to form the gate patterns including the gate line 121, the gate electrode 124, the one end of the gate line 129, and the storage electrode 132. For example, chromium (Cr), molybdenum tungsten (MoW), chromium/aluminum (Cr/Al), copper (Cu), aluminum neodymium (Al (Nd)), molybdenum/aluminum (Mo/Al), molybedenum aluminum neodymium (Mo/Al(Nd)), chromium/aluminum neodymium (Cr/Al(Nd)) and the like may be used as the gate metal using a single layer or a double layer structure.

Figure 5:
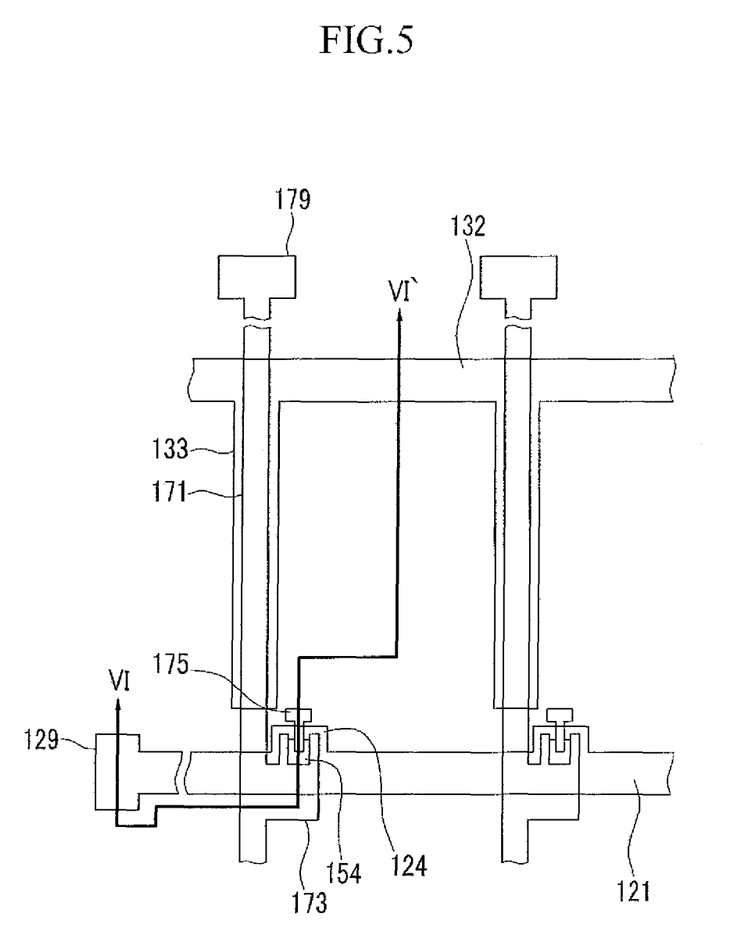
Figure 6A:
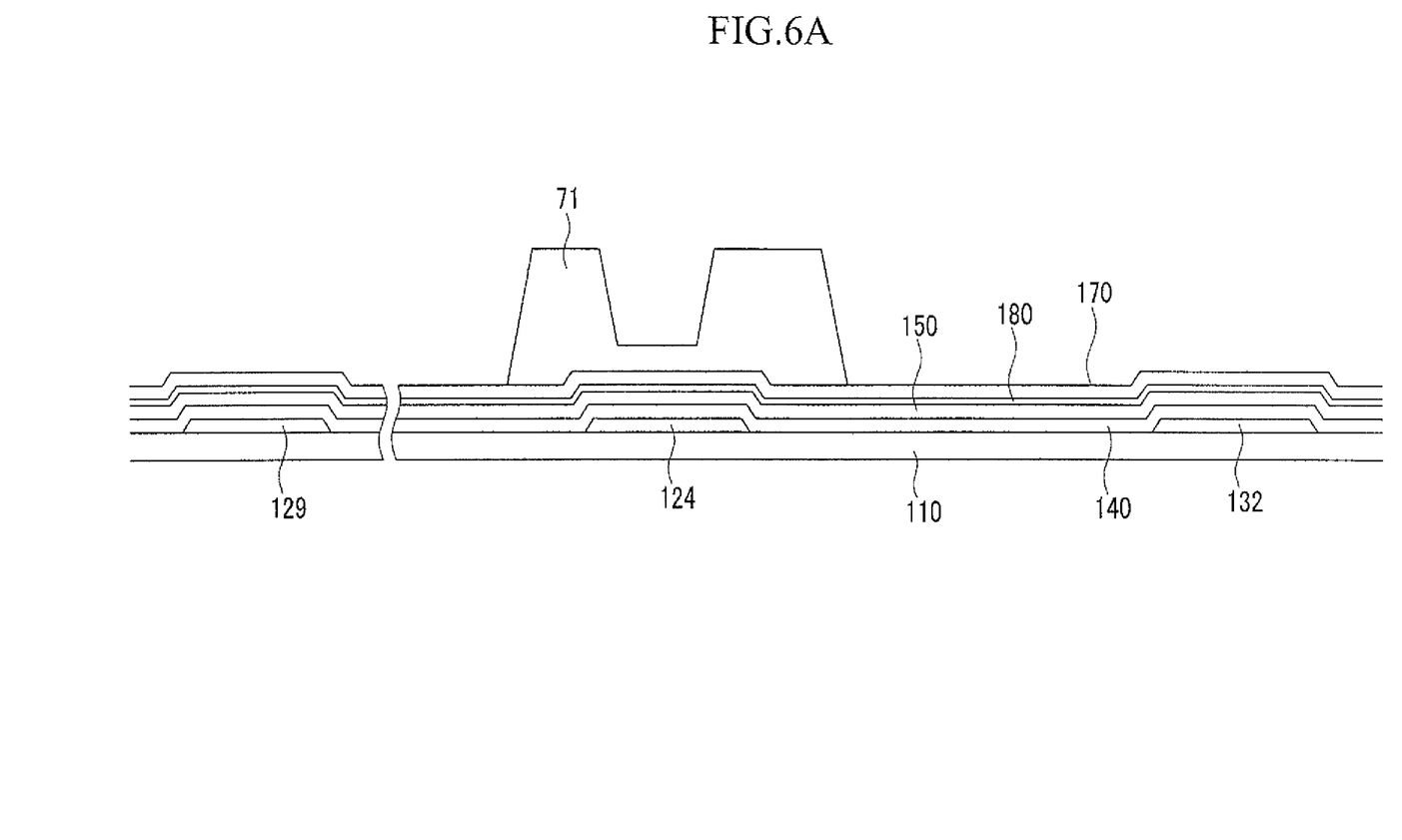
Figure 6B:
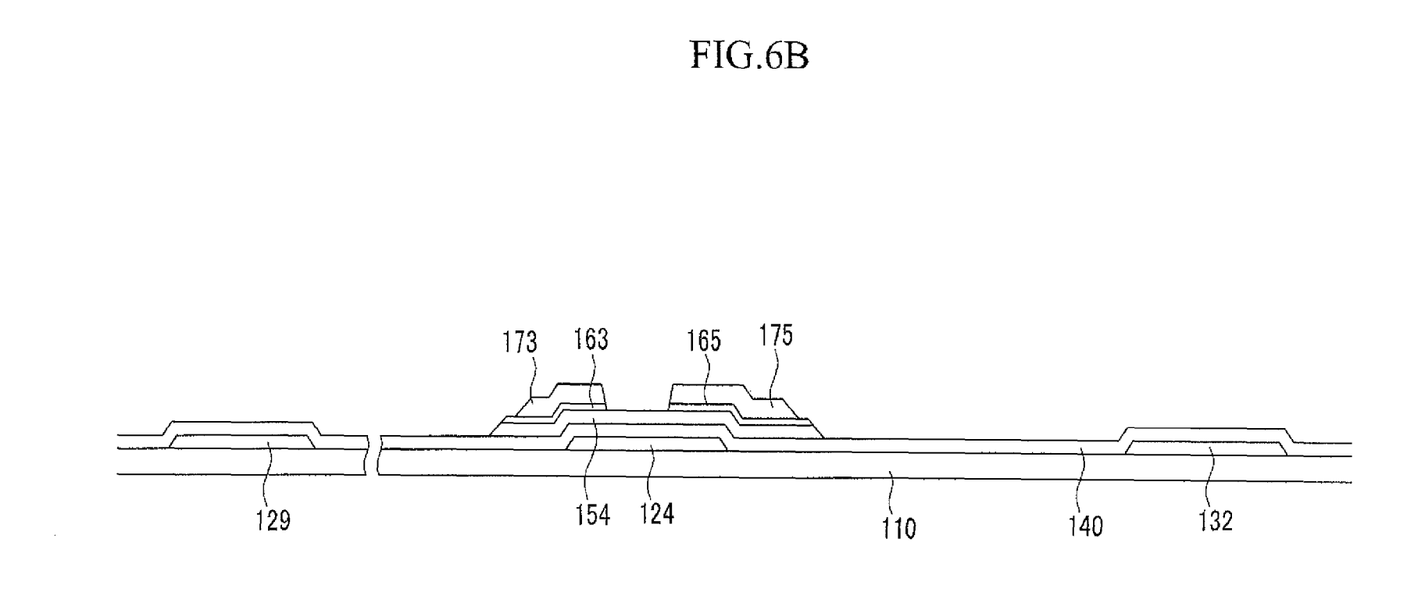

FIGS. 5 to 6B are a plan view and a sectional view, respectively, of the substrate including the source/drain pattern and the semiconductor pattern formed by the second mask process in the method of manufacturing the thin film transistor array substrate according to an exemplary embodiment of the present invention.

A gate insulating layer 140, an amorphous silicon layer 150, a n+amorphous silicon ohmic contact layer 160, and a data metal layer 170 may be sequentially formed on the lower substrate 110 having the gate patterns thereon by a deposition technique such as, for example, plasma enhanced chemical vapor deposition (PECVD) and sputtering. The gate insulating layer 140 may be made of, for example, an inorganic insulation material such as silicon nitride (SiNx). The data metal layer 170 may be made of, for example, molybdenum (Mo), titanium (Ti), tantalum (Ta) or molybdenum alloy.

A photo-resist pattern 71 may be formed on the data metal layer 170 by, for example, a photolithography process using a second mask and an etching process, as shown in FIG. 6A. In this case, a diffractive exposure mask having a diffractive exposing part at a channel portion of the thin film transistor may be used as a second mask, thereby allowing a photo-resist pattern 71 of the channel portion to have a lower height than a photo-resist pattern 71 of the source/drain pattern (173, 175 in FIG. 6B).

Subsequently, the data metal layer 170 may be patterned through, for example, a wet etching process using the photo-resist pattern 71 to thereby provide source/drain patterns including the data line 171, the source electrode 173, the drain electrode 175, which at this point is integral to the source electrode 173, and the one end of the data line 179.

Using the same photo-resist pattern 71, the amorphous silicon layer 150 and the n+amorphous silicon layer 160 may be patterned, for example, in a single dry etching process thereby forming the ohmic contact layer 163,165 and the active layer 154. Next, the photo-resist pattern 71 having a relatively low height at the channel portion, may be removed by, for example, an ashing process. Thereafter, the source/drain pattern and the ohmic contact layer 163,165 of the channel portion may be etched by, for example, through a dry etching process. Accordingly, the active layer 154 of the channel portion is preferably exposed to separate the source electrode 173 from the drain electrode 175, as shown in FIG. 6B.

Thereafter, a remainder of the photo-resist pattern left on the source/drain pattern part may be removed using, for example, a stripping process.

Figure 7:
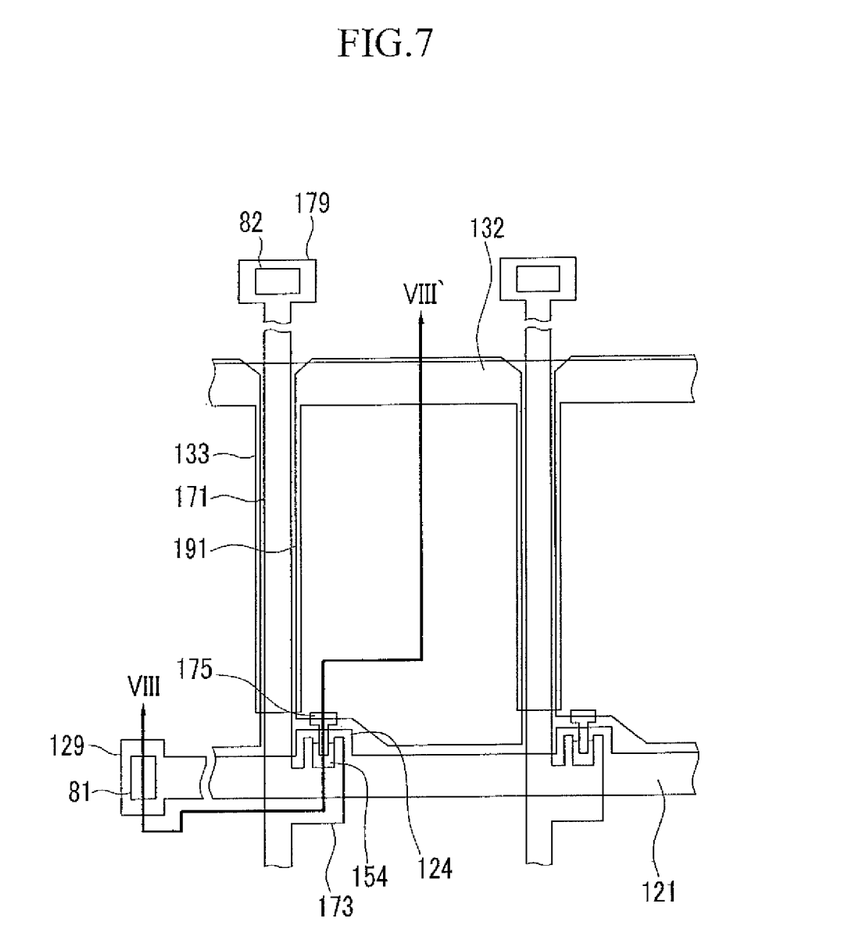
Figure 8A:
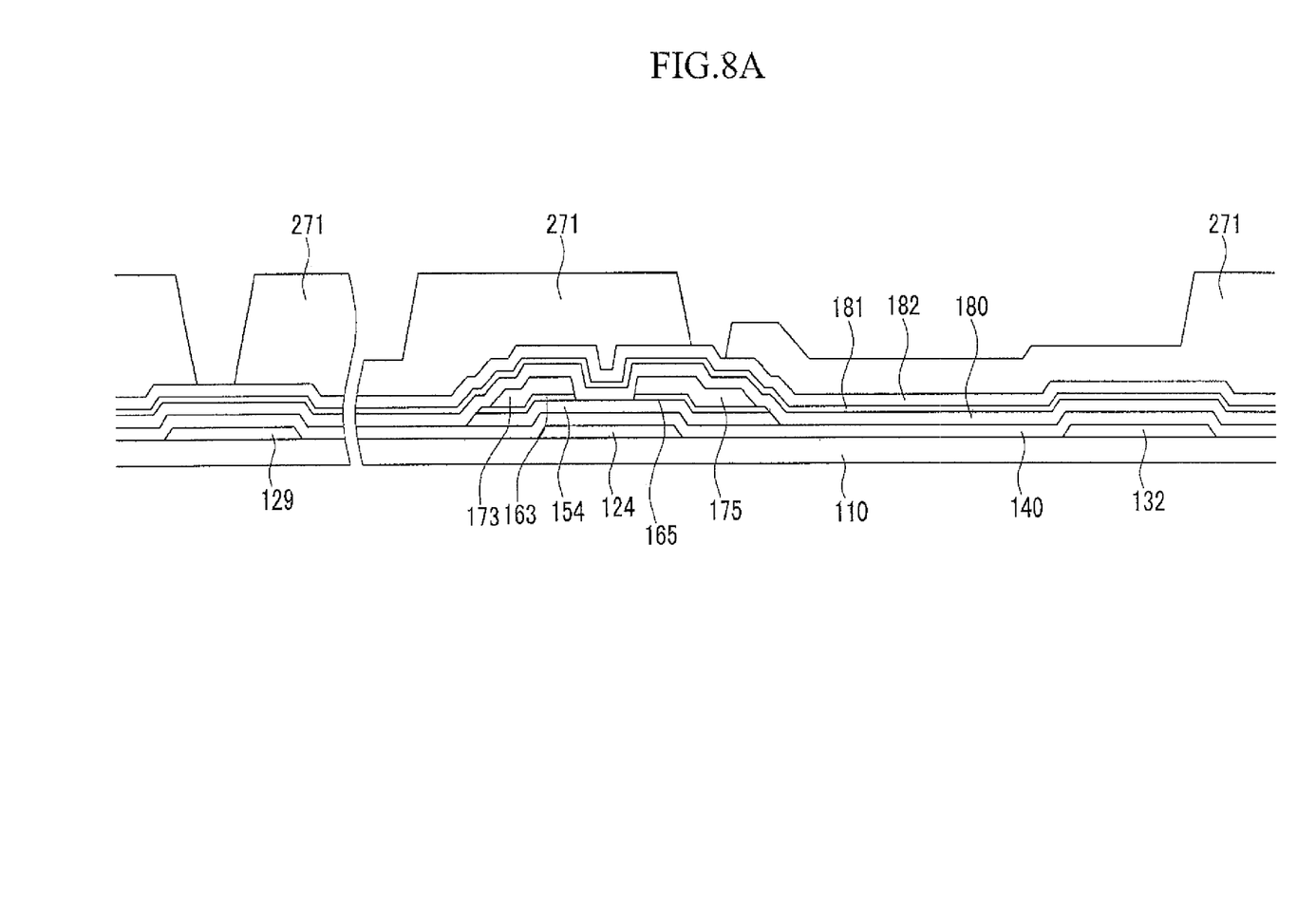
Figure 8B:
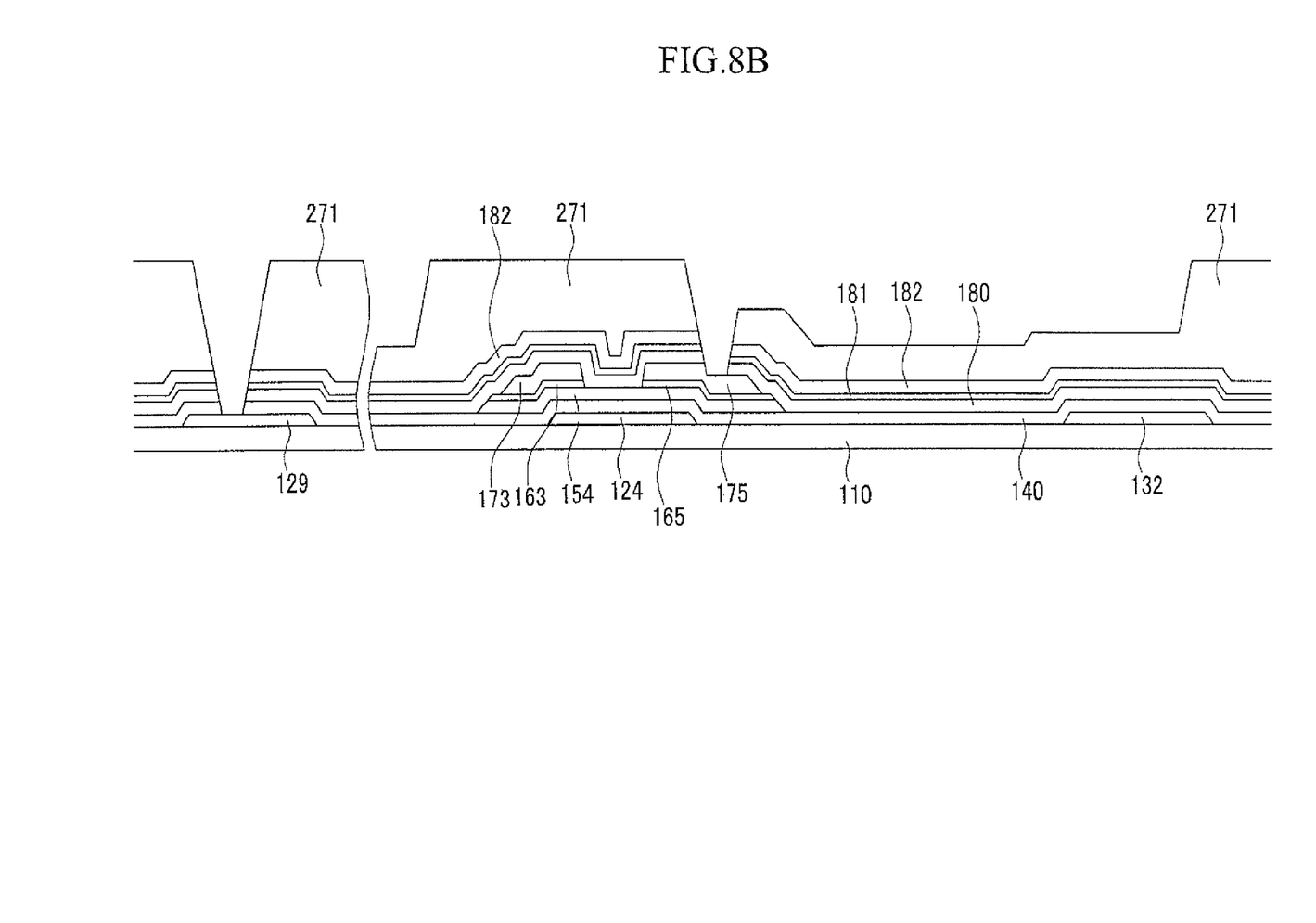
Figure 8C:
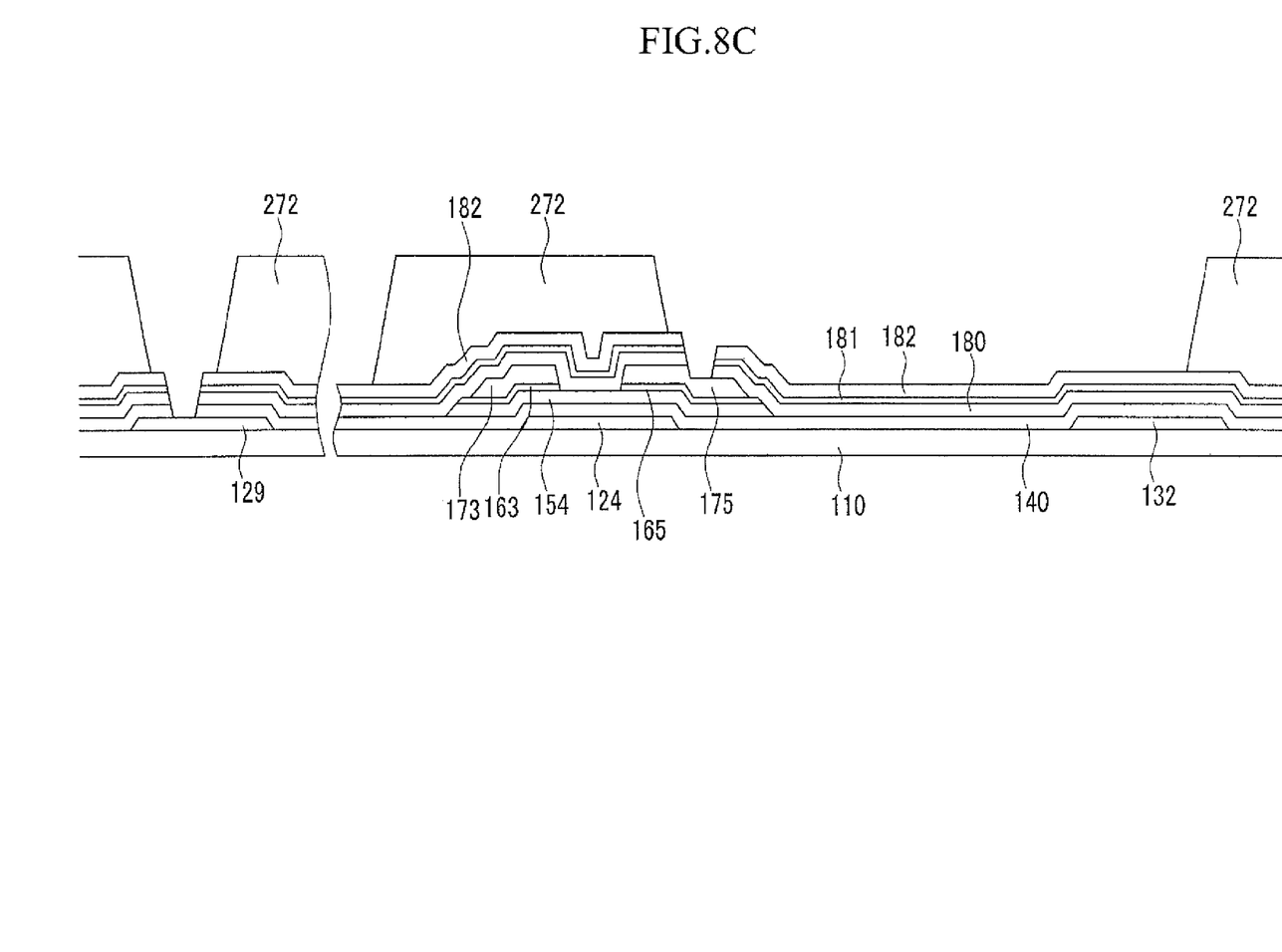
Figure 8D:
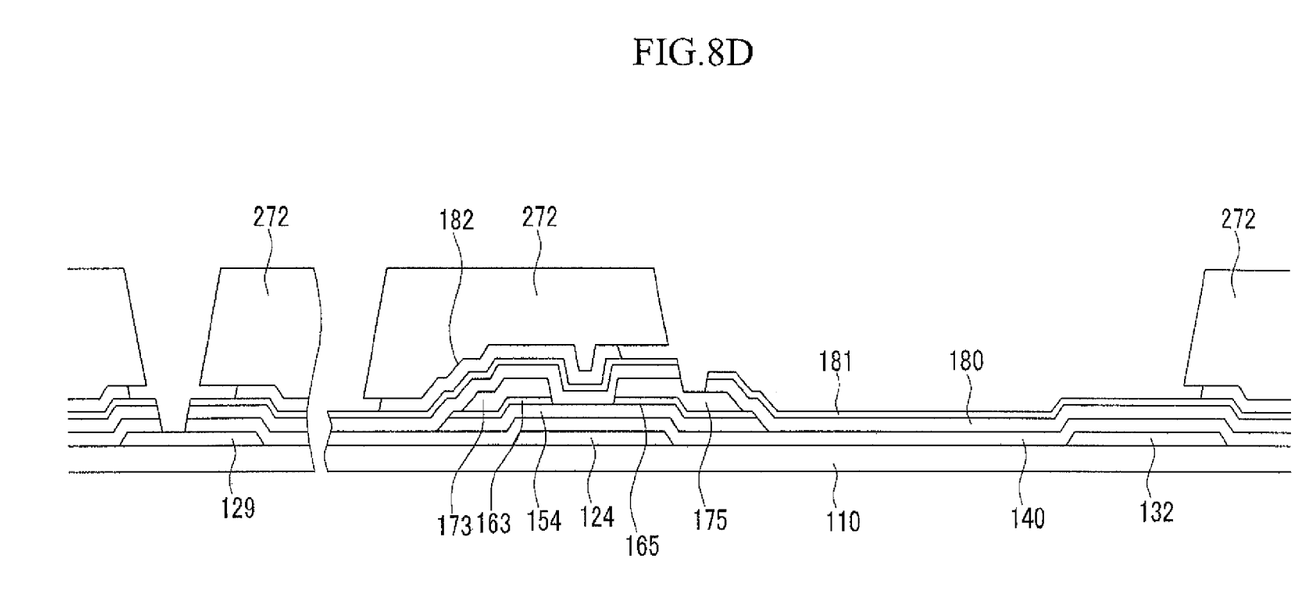
Figure 8E:
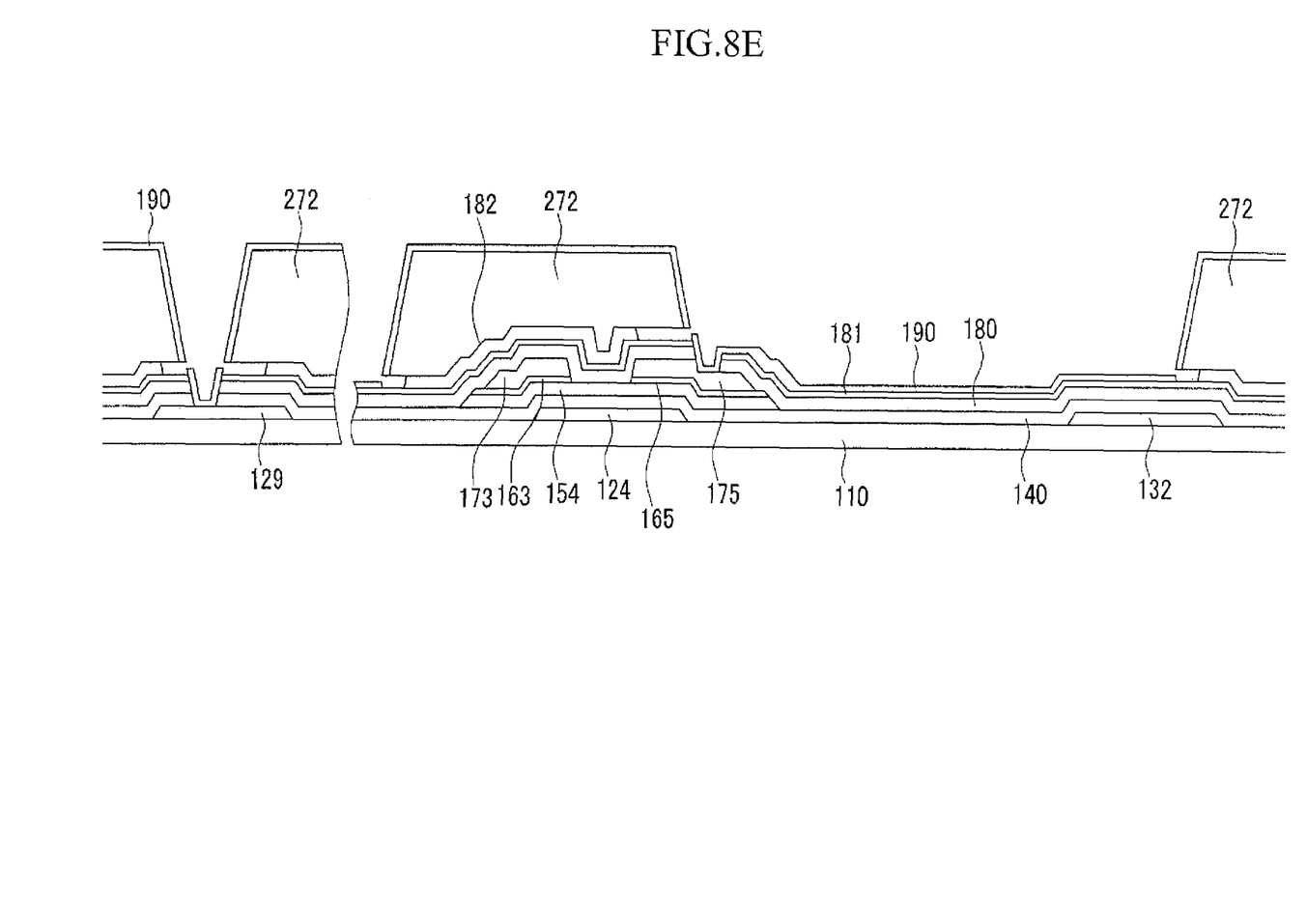
Figure 8F:
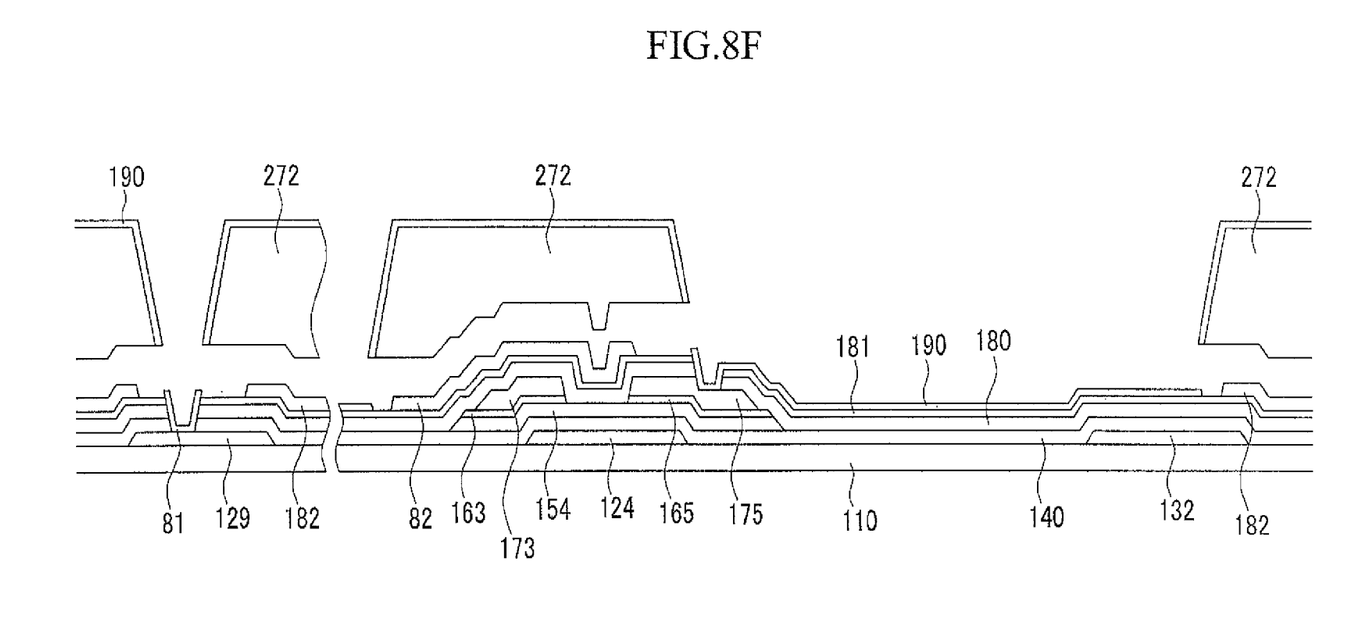

FIGS. 7 to 8F are plan views and sectional views of the substrate formed by the third mask process in a method of manufacturing the thin film transistor array substrate according to an exemplary embodiment of the present invention.

The first passivation film 180, which may include, for example, an inorganic insulating material such as silicon oxide (SiOx) and silicon nitride (SiNx), an organic insulating material having a small dielectric constant such as, for example, an acrylic organic compound, BCB (benzocyclobutene), PFCB (perfluorocyclobutane) or the like, and the laminated structure thereof may be entirely deposited by a deposition technique such as, for example, a plasma enhanced chemical vapor deposition (PECVD) technique on the gate insulating film 140 having the source/drain patterns thereon.

Next, the second passivation layer protecting the first passivation layer over the first passivation layer may be entirely deposited by the same method as the first passivation layer. The second passivation material may comprise, for example, inorganic insulating material such, as silicon nitride (SiNx), silicon oxide (SiOx), or silicon oxynitride (SiOxNy). For example, when using SiOxNy as a second passivation material, it is desirable that the SiOxNy contain an oxygen content between about 10 and about 50% and a y value between about 0.2 and about 1.3. The second passivation layer may protect the first passivation layer during the excessive over etch process from damage in the formation of undercut region of the third passivation layer located directly below the photoresist pattern. Therefore, it is desirable for the second passivation inorganic insulating layer to have a low etch rate compared to the first passivation layer under the same etch conditions. That is to say, It is desirable for the second passivation layer to have an etch selectivity value under about 2:1 compared to the first passivation layer.

Next, the third passivation layer may comprise, for example, inorganic insulating material such as SiNx, SiOx, or SiOxNy. The third passivation layer may be entirely deposited over the second passivation layer by the same method as the first passivation layer. Positioned directly below the photoresist pattern used as a mask to pattern the first 180, the second 181, and the third passivation layer 182, the third passivation layer functions as a sacrificial layer to readily form the undercut region. Therefore, it is desirable for the third passivation inorganic insulating layer to have a high etch rate compared to the first passivation layer under the same etch conditions. That is to say, It is desirable for the third passivation layer to have an etch selectivity value over about 2:1 compared to the first passivation layer.

Also, a photo-resist may be entirely applied on the passivation film 180. Subsequently, a photo-resist pattern 271 may be formed by, for example, a photolithography process using a third mask, as shown in FIG. 8A. The first photoresist pattern 271 includes the first portion which is formed on parts of the drain electrode 175 and on the pixel region, the second portion which is formed on the source electrode 173, on the data line 171, and on the channel region, and the third region which expose parts of the drain electrode 175, the end portions of the gate line 129, and the end portions of the data line. The pixel region corresponds to the area forming the pixel electrode (191 in FIG. 1). The first portion has a relatively lower height than the second portion, and may be removed later by, for example, an ashing process.

Subsequently, referring to FIG. 8B, the passivation film 180,181,182 may be patterned by, for example, dry-etching using the photo-resist pattern 271 as a mask. The gate insulating layer 140 and the passivation layer 180,181,182 on the upper part of the ends of the gate line 129, and the passivation layer 180,181,182 on the upper part of the ends of the data line 179 may be etched simultaneously.

Next, referring to FIG. 8C, a photo-resist pattern 272 that partially exposes an upper side of the drain electrode, circumferences of one end of the data line, and an area in which a pixel electrode will be formed is patterned by, for example, an etch-back process all over the surface of the photo-resist pattern. The etch-back process over the surface of the photo-resist pattern 271 is performed through, for example, a dry ashing technique using, for example, oxygen ($O_2$) plasma.

Next, referring to FIG. 8D, the third passivation layer 182 may be patterned by, for example, dry-dryching using the photoresist pattern 272. Positioned directly below the photoresist pattern used as a mask to pattern the first 180, the second 181, and the third passivation layer 182, the third passivation layer function as a sacrificial layer to readily form the undercut region. Therefore, it is desirable that the third passivation inorganic insulating layer have a high etch rate compared to the first passivation layer under the same etch conditions. That is to say, It is desirable for the third passivation layer to have an etch selectivity value, for example, over about 2:1 compared to the first passivation layer. As shown in FIG. 8D, the third passivation film is over-etched to form an undercut profile beneath the photoresist pattern 272 on the drain electrode, while the second passivation layer 181 may be less etched away due to the higher etch selectivity compared to the third passivation layer 182. To etch away the third passivation layer 182, exemplary embodiments of the present invention employ an etching gas which includes, for example, a mixture of sulfur hexa fluoride ($SF_6$) and oxygen ($O_2$). For example, if pressure is raised, a number of collisions over time between gas molecules increases and therefore, a mean free path may become shorter. As a result, a straight trajectory of the of the gas molecules may be decreased and thus irregular movement, left and right, and upward and downward, of the gas molecules may increase. Accordingly, the lateral surface of the third passivation film 182 formed beneath the photo-resist pattern 272 undergoes much more influence by the increased number of gas molecules moving left and right, and upward and downward. Thus, the third passivation film 182 formed beneath the photo-resist pattern 272 may become over-etched. Thus, due to the over-etched profile of the third passivation layer 182 beneath the photo-resist pattern 272, the transparent electrode pattern 190 can be readily formed using a lift-off method according to exemplary embodiments of the present invention.

Therefore, by using the first passivation layer 180 to cover the channel region, the second passivation layer 181 having a higher etch selectivity compared to the third passivation layer to protect the first passivation layer, and the third passivation layer to form the undercut region, it may be possible to reduce the defects of consumption of the first passivation layer 180 effectively during the over-etch process to form the undercut region in the three-round mask process using the lift-off process according to exemplary embodiments of the present invention.

Subsequently, referring to FIG. 8E and FIG. 8F, a transparent electrode material 190 may be deposited on the entire substrate by a deposition method such as, for example, a sputtering method on the substrate 110 having the remainder of the photo-resist pattern 272. The transparent electrode material 190 may be made of, for example, an indium-tin-oxide (ITO), a tin-oxide (TO) or an indium-zinc-oxide (IZO).

The photo-resist pattern 272 may then be removed by, for example, a stripping process using a lift-off method on the thin film transistor array substrate on which the transparent electrode material 190 is substantially entirely deposited. The transparent electrode material 190 deposited on the photo-resist pattern 272 may be removed together with the photo-resist pattern 272, as shown in FIG. 8F, to form the transparent pattern including the upper gate pad electrode, the pixel electrode 191, and the upper data pad electrode.

As described above, the method of manufacturing the thin film transistor array substrate according to exemplary embodiments of the present invention may be capable of simplifying the configuration of the substrate and the manufacturing process by adopting the three-round mask using the lift-off method. Accordingly, it may be possible to further decrease manufacturing costs and increase manufacturing yield.

For example, in some exemplary embodiments of the present invention, by using the first passivation layer 180 to cover the channel region, the second passivation layer 181 having a higher etch selectivity compared to the third passivation layer to protect the first passivation layer, and the third passivation layer to form the undercut region, it may be possible to apply the lift-off process effectively in the three-round mask process.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method for manufacturing a thin film transistor array substrate for a display panel comprises:
    forming a gate pattern on a substrate, wherein the gate pattern includes a gate electrode, a plurality of gate lines and a plurality of storage electrode lines;
    forming a gate insulating film on the gate pattern including the gate electrode, the plurality of gate lines and the plurality of storage electrode lines;
    forming a source/drain pattern and a semiconductor pattern on the substrate, wherein the source/drain patterns includes a plurality of data lines, a source electrode and a drain electrode;
    forming a first passivation film, a second passivation film, and a third passivation film successively on the substrate;
    forming a first photoresist pattern which includes a first portion formed on part of the drain electrode and on a pixel region and a second portion formed on the semiconductor pattern which includes a channel region between the source electrode and the drain electrode, and wherein the second portion of the photoresist pattern has a relatively higher height than the first portion;
    patterning an exposed portion of the first passivation film, the second passivation film and the third passivation film using the first photoresist pattern;
    forming a second photoresist pattern by removing the first portion of the first photoresist pattern using an etch-back process;
    patterning an exposed portion of the third passivation layer around the pixel region using the second photoresist pattern, wherein the patterning of the third passivation film includes over-etching the third passivation film;
    forming a transparent electrode film on the substrate; and
    removing the second photoresist pattern and the transparent electrode film disposed on the second photoresist pattern to form a transparent electrode pattern on the second passivation layer.

2. The method of claim 1, wherein the transparent electrode pattern includes a pixel electrode, an upper gate pad electrode and upper data pad electrode.

3. The method of claim 2, wherein the pixel electrode is formed having a plane shape and wherein the plane shape of the pixel electrode is substantially the same as a plane shape in an open region of the second photoresist pattern.

4. The method of claim 1, wherein the over-etching of the third passivation layer is performed using an etching gas including a mixture of sulfur hexa fluoride ($SF_6$) and oxygen ($O_2$).

5. The method of claim 4, wherein the third passivation layer has a high etch rate compared to the first passivation layer under the same etch conditions.

6. The method of claim 5, wherein the third passivation layer has an etch selectivity value over about 2:1 compared to the first passivation layer.

7. The method of claim 1, wherein the transparent electrode film is made of one of indium-tin-oxide (ITO), a tin-oxide (TO) and an indium-zinc-oxide (IZO).

* * * * *